(12) United States Patent
Ozawa (10) Patent No.: US 8,258,565 B2
(45) Date of Patent: Sep. 4, 2012

(54) NONVOLATILE SEMICONDUCTOR MEMORY DEVICE AND FABRICATING THE SAME

(75) Inventor: Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 301 days.

(21) Appl. No.: 12/640,182

(22) Filed: Dec. 17, 2009

(65) Prior Publication Data

US 2010/0155805 A1 Jun. 24, 2010

(30) Foreign Application Priority Data

Dec. 18, 2008 (JP) .................. P2008-322705

(51) Int. Cl.
 *H01L 29/788* (2006.01)

(52) U.S. Cl. ............. 257/315; 257/317; 257/E29.3; 257/E29.129; 257/E21.422; 438/257; 438/261

(58) Field of Classification Search .............. 257/315, 257/317, E29.3, E29.129, E21.422; 438/257, 438/261

See application file for complete search history.

(56) References Cited

U.S. PATENT DOCUMENTS

| 5,869,858 A | 2/1999 | Ozawa et al. | |
|---|---|---|---|
| 2007/0290274 A1* | 12/2007 | Yaegashi | 257/390 |
| 2009/0108323 A1* | 4/2009 | Jee et al. | 257/315 |

FOREIGN PATENT DOCUMENTS

| JP | 2006-41489 | 2/2006 |
|---|---|---|
| JP | 2006-93327 | 4/2006 |

* cited by examiner

*Primary Examiner* — Tu-Tu Ho
(74) *Attorney, Agent, or Firm* — Finnegan, Henderson, Farabow, Garrett & Dunner, L.L.P.

(57) ABSTRACT

There is provided a nonvolatile semiconductor memory device, including, a tunnel insulator, a floating gate electrode including a first floating gate electrode and a second floating gate electrode being constituted with a nondegenerate state semiconductor, an intergate insulating film formed to cover at least continuously an upper and a portion of a side surface of the floating gate electrode, and a control gate electrode in order, and an isolation insulating film, a lower portion of the isolation insulating film being embedded in the semiconductor substrate in both sides of the floating gate electrode along a channel width direction, an upper portion of the isolation insulating film contacting with a side surface of the first floating gate electrode and protruding to a level between an upper surface of the semiconductor substrate and an upper surface of the first floating gate electrode.

16 Claims, 11 Drawing Sheets

NONVOLATILE SEMICONDUCTOR MEMORY DEVICE AND FABRICATING THE SAME

CROSS REFERENCE TO RELATED APPLICATION

This application is based upon and claims the benefit of priority from the prior Japanese Patent Application No. JP2008-322705, filed Dec. 18, 2008; the entire contents of which are incorporated herein by reference.

FIELD OF THE INVENTION

The present invention relates to a non-volatile semiconductor memory device, and more particularly, to a non-volatile semiconductor memory device for improving a memory cell transistor structure having a floating gate electrode.

DESCRIPTION OF THE BACKGROUND

An electrically erasable non-volatile semiconductor memory using a floating gate electrode has been used as a non-volatile semiconductor memory device. NAND-type flash memory has been known as a representative in the non-volatile semiconductor memory and has been increasingly demanded as a device for storing data. In the NAND-type flash memory, for example, a memory cell transistor in which a width of a lower portion in a floating gate electrode is wider than a width of a portion other than the lower portion has been developed for higher packing density of the memory cell transistor as disclosed in Japanese Patent Publication (Kokai) No. 2006-93327.

As the highest electric field is applied to an upper edge portion of the floating gate electrode, a leakage current of an inter-gate insulating film is increased in the memory cell transistor. As a result, problems such as lowering of writing speed and erasing speed on the memory cell transistor and fluctuation of a stored charge amount are generated. The problems become remarkable when the width of the gate electrode in the memory cell transistor is shrunk to be high packing density.

SUMMARY OF THE INVENTION

According to an aspect of the invention, there is provided, a nonvolatile semiconductor memory device, including, a semiconductor substrate, a tunnel insulator on the semiconductor substrate, a floating gate electrode including a first floating gate electrode on the tunnel insulator and a second floating gate electrode on the first floating gate electrode, the second floating gate electrode being constituted with a nondegenerate state semiconductor including a conductive impurity element, an intergate insulating film formed to cover at least continuously an upper and a portion of a side surface of the floating gate electrode, a control gate electrode on the intergate insulating film, and an isolation insulating film, a lower portion of the isolation insulating film being embedded in the semiconductor substrate in both sides of the floating gate electrode along a channel width direction, an upper portion of the isolation insulating film contacting with a side surface of the first floating gate electrode and protruding to a level between an upper surface of the semiconductor substrate and an upper surface of the first floating gate electrode.

Further, according to an aspect of the invention, there is provided, a method for fabricating a nonvolatile semiconductor memory device, including, forming a first insulating film, a conductive film, a nondegenerate state semiconductor film on a semiconductor substrate in order, etching the first insulating film, the conductive film, the nondegenerate state semiconductor film and the semiconductor substrate so as to form a tunnel insulating film, a floating gate electrode including a first floating gate electrode and a second floating gate electrode with the nondegenerate state on the semiconductor substrate, respectively, and to form a groove in the semiconductor substrate, embedding an isolation insulating film in the groove, a portion between the tunnel insulating film and a lower portion between the first floating gate electrodes, forming an intergate insulating film on the floating gate electrode and the isolation insulating film, forming a control gate electrode on the intergate insulating film.

DETAILED DESCRIPTION OF THE INVENTION

A NAND-type flash memory being electrically erasable will be described below in detail with reference to the attached drawings as a non-volatile semiconductor memory device according to an embodiment of the present invention. It should be noted that the present invention is not restricted to the embodiments but covers their equivalents. Throughout the attached drawings, similar or same reference numerals show similar, equivalent or same components.

First Embodiment

Figure 1:
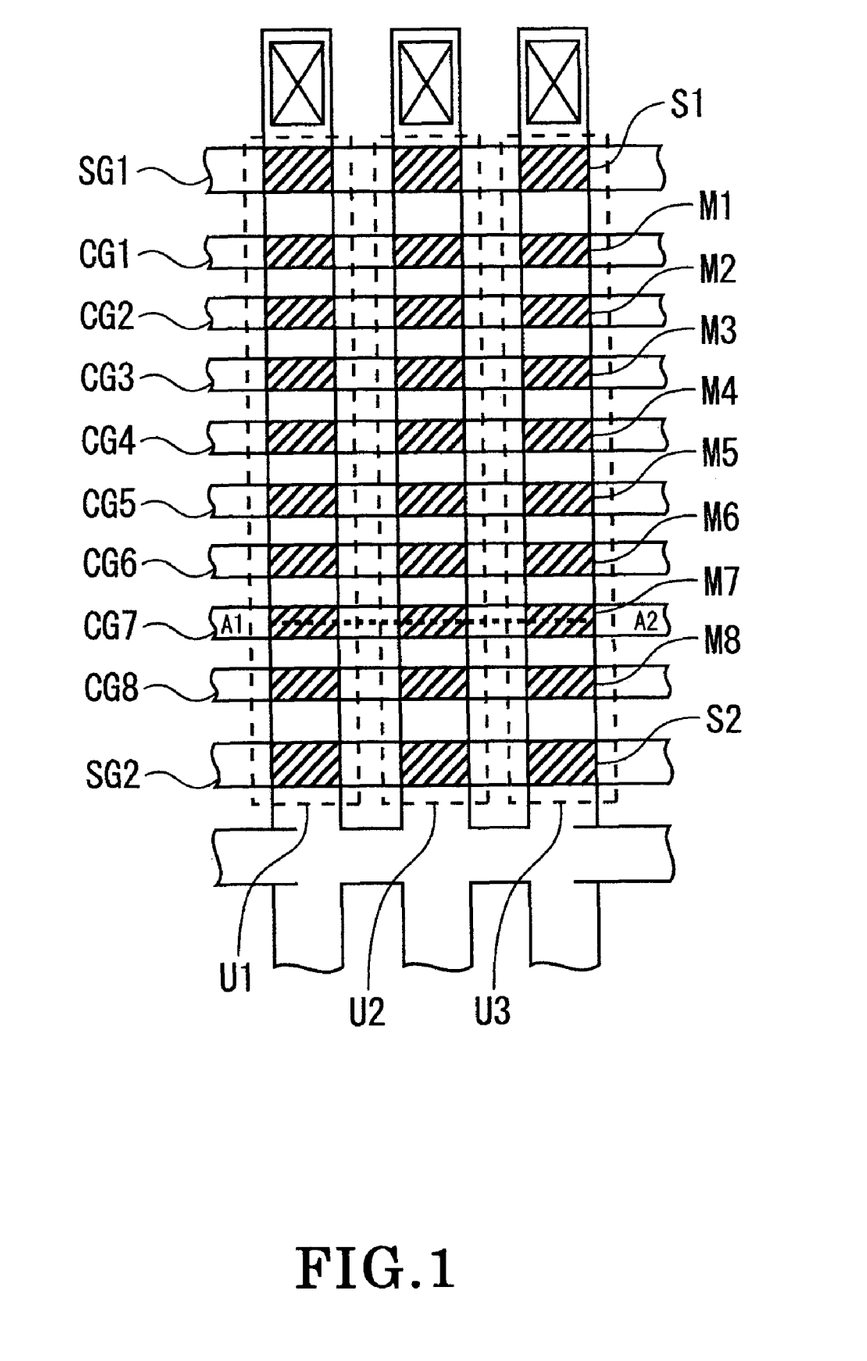
FIG. 1 is a schematic plane view showing a constitution of a NAND-type flash memory according to a first embodiment of the present invention.
Figure 2:
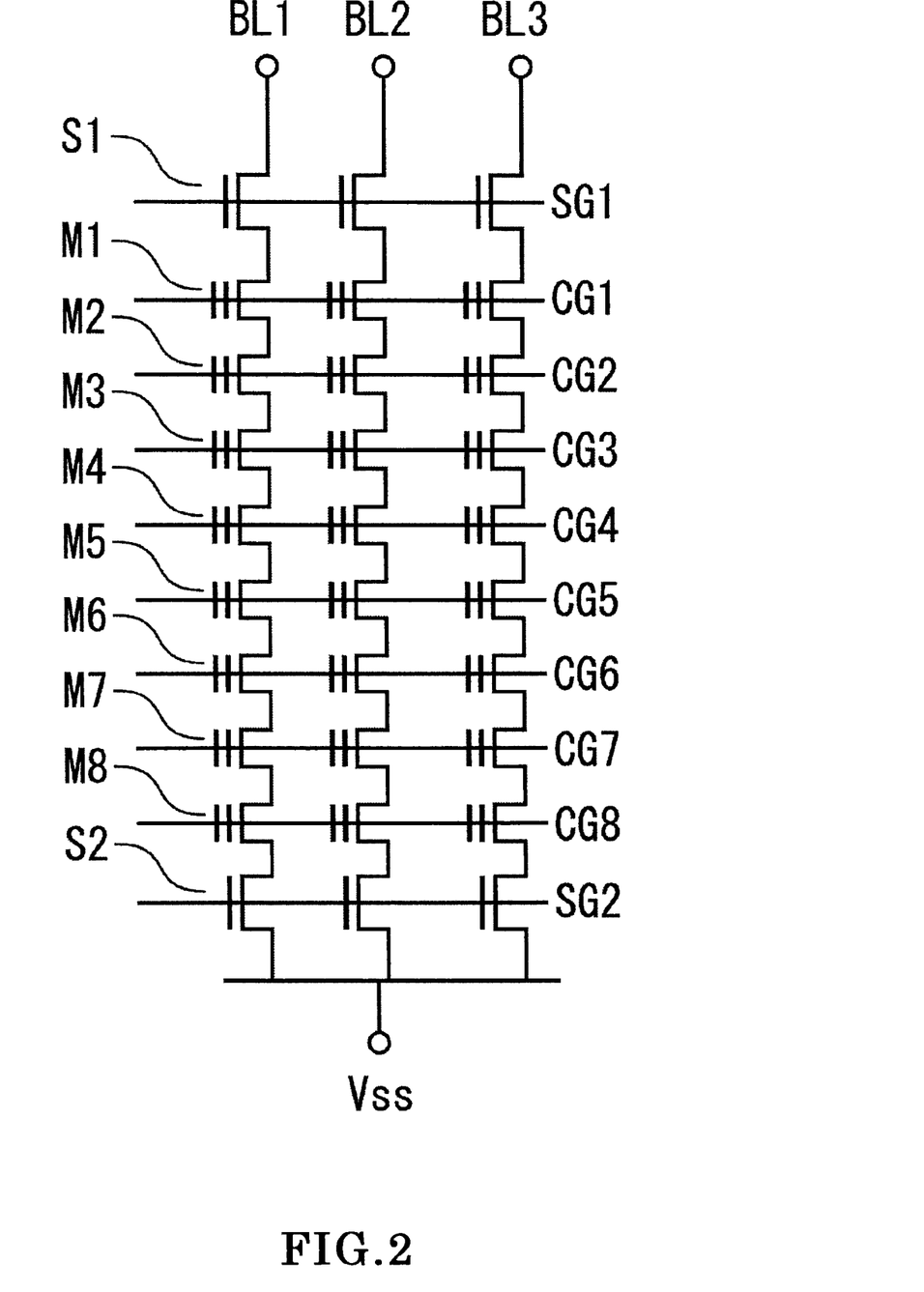
FIG. 2 is an equivalent circuit diagram showing connections in the NAND-type flash memory according to the first embodiment of the present invention.

FIG. 1 is a schematic plane view showing a constitution of a NAND-type flash memory according to a first embodiment of the present invention and FIG. 2 is an equivalent circuit diagram showing the NAND-type flash memory according as shown in FIG. 1.

As shown in FIGS. 1 and 2, in the NAND-type flash memory, a plurality of NAND unit cells U1-U3 (merely called a unit cell, hereafter) are configured to at intervals each other in a row direction. Each cell unit U1-U3 includes a plurality of selection transistors S1, S2 and a plurality of memory cell transistors M1-M8. The plurality of memory cell transistors M1-M8 are configured between the selection transistors S1, S2 in a column direction and are serially connected each other.

selection transistor S1, S2 in each of the cell units U1-U3 are connected to selection gate line SG1, SG2 configured in the row direction, respectively. Each of the memory cell transistors M1-M8 are connected to each of control gate lines CG1-CG8, which are called as a word line, configured in the column row direction, respectively. Further, each of the selection transistors S1, S2 in each of the cell units U1-U3 are connected to each of bit lines BL1-BL3, respectively. Each of the selection transistors S2 are connected to a source voltage Vss. Here, a case of eight memory cell transistors is demonstrated. However, an amount of the memory cell transistors is not restricted to eight. A case of three cell units is also demonstrated. However, the amount of memory cell transistors is not restricted to three.

Figure 3:
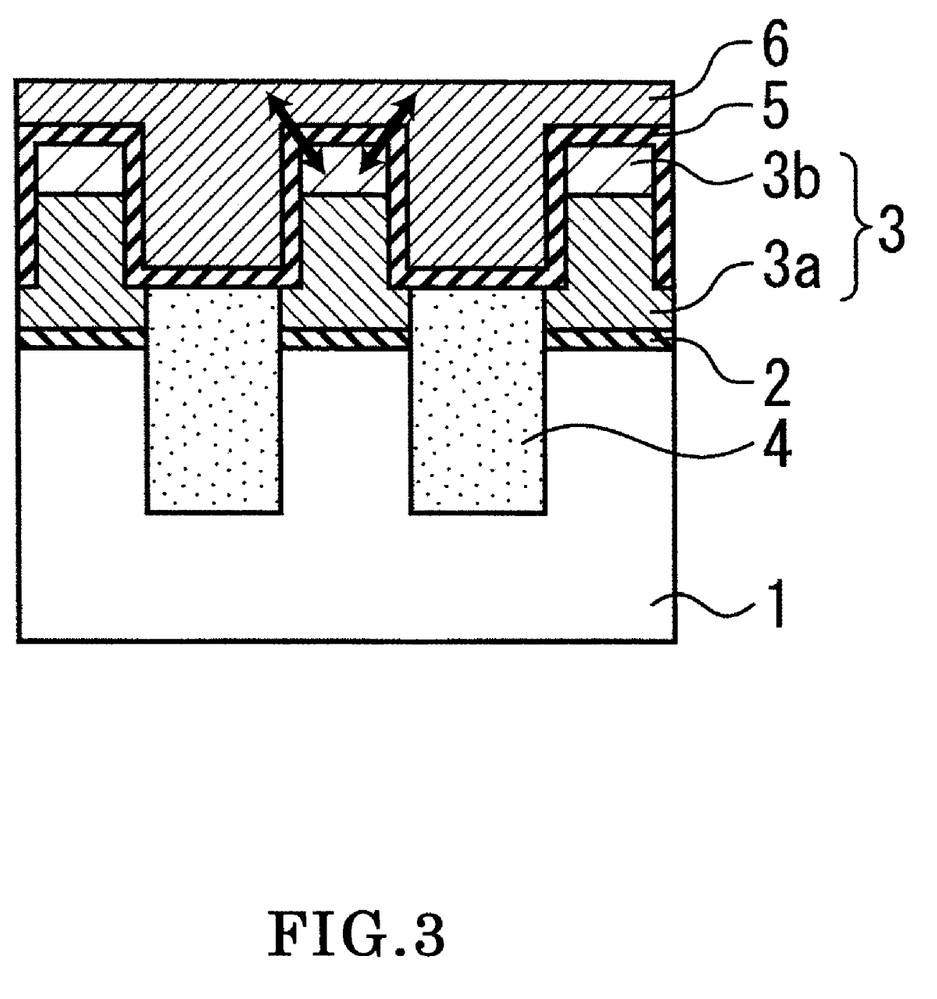
FIG. 3 is a cross-sectional view showing a structure of the NAND-type flash memory according to the first embodiment of the present invention.

FIG. 3 is a cross-sectional view showing a structure of the memory cell transistor according to the first embodiment of the present invention. FIG. 3 is the cross-sectional view along A1-A2 line in FIG. 1 and shows a cross-section along a word line direction which is also called as a channel width direction.

As shown in FIG. 3, each of memory cell transistors M1-M8 includes a semiconductor substrate 1, a floating gate electrode 3 on the semiconductor substrate 1 through a tunnel insulating film 2, an intergate insulating film 5 on the floating gate electrode 3, a control gate electrode 6 on the intergate insulating film 5 and an isolation insulating film 4 between the floating gate electrodes 3.

The semiconductor substrate 1 is constituted with a silicon crystal, for example. The tunnel insulating film 2 is constituted with a silicon oxide film, a silicon oxy-nitride film or the like, typically has a thickness of 5-10 nm.

The floating gate electrodes 3 are configured at intervals on the semiconductor substrate 1 through the tunnel insulating film 2. The floating gate electrode 3 has a first floating gate electrode 3a and a second floating gate electrode 3b stacked on the first floating gate electrode 3a.

The first floating gate electrode 3a is constituted with a poly-crystalline silicon film doped with a conductive impurity, for example, phosphorus of a concentration over $10^{20}$ atoms/cm$^3$. The second floating gate electrode 3b is constituted with a poly-crystalline silicon film doped with a conductive impurity, for example, phosphorus of a concentration below $3\times10^{19}$ atoms/cm$^3$, is so called a nondegenerate state semiconductor.

Here, nondegenerate state means Fermi level is located in forbidden band of the semiconductor. Actually, in a case of the second floating gate electrode 3b constituted with silicon, the second floating gate electrode 3b is arranged at nondegenerate state in an operating temperature of a conventional memory cell transistor when an n-type conductive impurity concentration in the second floating gate electrode 3b is below $3\times10^{19}$ atoms/cm$^3$. Further, as same as the case mentioned above, in the case of the second floating gate electrode 3b constituted with silicon, the second floating gate electrode 3b is arranged at the nondegenerate state in the operating temperature of the conventional memory cell transistor when a p-type conductive impurity concentration in the second floating gate electrode 3b is below $1\times10^{19}$ atoms/cm$^3$.

When the second floating gate electrode 3b is arranged at the nondegenerate state, generation of electric field between the floating gate electrode 3 and the control gate electrode 6 originates a voltage drop at the second floating gate electrode 3b as the same condition as writing, erasing, reading or charge retention in the memory cell transistor. In other words, a voltage applied to the intergate insulating film 5 is lowered at amount of built-in potential in the second floating gate electrode 3b. Each ideal value can be represented by formulas described below, where the voltage drops of an n-type semiconductor and a p-type semiconductor are ΔVn and ΔVp, respectively.

$$\Delta Vn = k \times T/q \times \ln(Nc/Nd) \tag{1}$$

$$\Delta Vp = k \times T/q \times \ln(Nv/Na) \tag{2}$$

Here, k is Boltzmann constant, T is temperature, q is charge amount, Nc is effective density of states in conduction band, Nd is donor density, Nv is effective density of states in valence band and Na is acceptor density.

k and q are constants. T is an operating temperature of the memory cell transistor. Nc and Nv are determined by a material of the floating gate electrode 3, for example, silicon. Furthermore, decreasing the n-type conductive impurity concentration causes decreasing the Nd, when the second floating gate electrode 3b is doped with the n-type conductive impurity. Accordingly, ΔVn is larger than the value in formula (1). As similarly, decreasing the p-type conductive impurity concentration causes increasing Na, when the second floating gate electrode 3b is doped with the p-type conductive impurity. Accordingly, ΔVp is larger than the value in formula (2).

Figure 4:
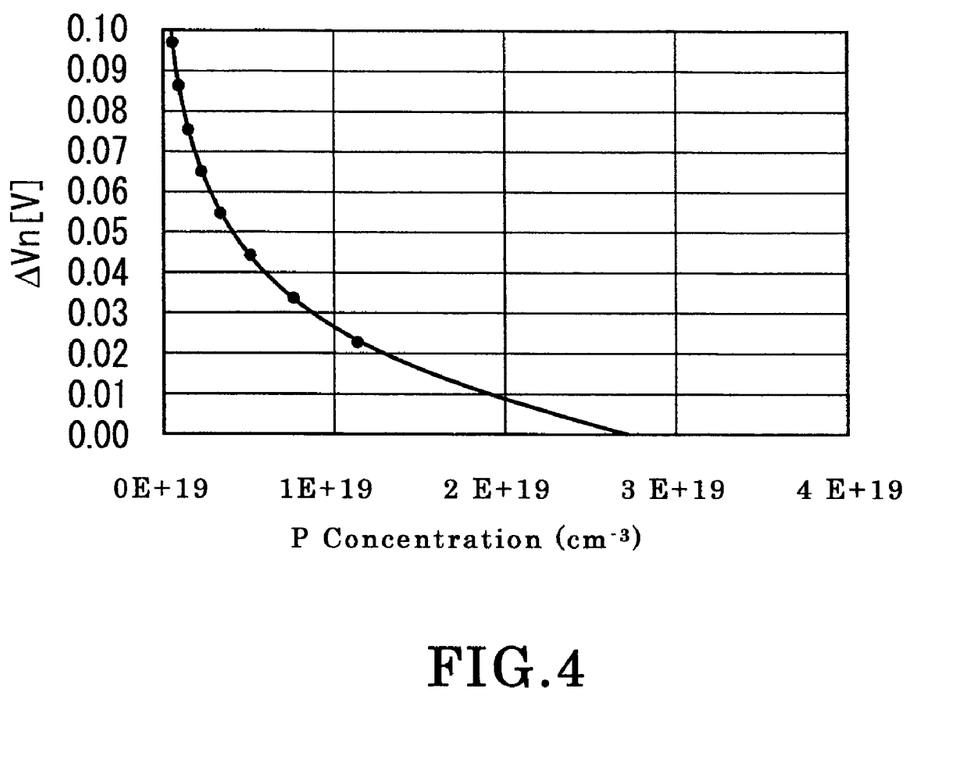
FIG. 4 is a characteristic diagram showing voltage drop in the NAND-type flash memory according to the first embodiment of the present invention.

For example, when the second floating gate electrode 3b constituted with silicon is doped with phosphorous as the conductive impurity to form the n-type semiconductor, ΔVn at T being 300K can be shown in FIG. 4 from the above formula (1). When a phosphorus concentration is below $3\times10^{19}$ atoms/cm$^3$, ΔVn is over zero. In other words, originating the voltage drop can be described. The voltage drop releases an electric field of a portion of the intergate insulating film 5 contacting with the floating gate electrode 3b. Generally, an upper edge portion of the floating gate electrode 3 has especially higher electric field, accordingly, a leakage current is applied in the intergate insulating film 5 as shown by an arrow in FIG. 3. However, the second floating gate electrode 3b is arranged to be the nondegenerate state semiconductor in the embodiment, so that a leakage current of the intergate insulating film 5 can be suppressed.

Furthermore, the conductive impurities doped in the first floating gate electrode 3a and the second floating gate electrode 3b are not restricted the same element. For example, arsenic with lower diffusivity is doped in the first floating gate electrode 3a and phosphorous with higher diffusivity is doped in the second floating gate electrode 3b. Both suppressing depletion of the first floating gate electrode 3a and retaining the nondegenerate state of the second floating gate electrode 3b can be obtained. As a result, writing speed and erasing speed of the memory cell transistor can be lead to higher, and fluctuation of cell characteristics can be reduced.

As another case, the conductive impurities doped in the first floating gate electrode 3a and the second floating gate electrode 3b are not restricted to the same conductive type. For example, arsenic with lower diffusivity is doped in the first floating gate electrode 3a and boron with higher diffusivity is doped in the second floating gate electrode 3b. In this case, amount of the voltage drop ΔV applied to the intergate insulating film 5 becomes a value deriving ΔVp represented in formula (2) from a band gap voltage of the semiconductor material constituting the floating gate electrode, nearly 1.1V of silicon in this embodiment. Accordingly, the value obtained is larger than from 0.5V to 1.0V. Consequently, writing speed and erasing speed of the memory cell transistor can be lead to greatly higher and fluctuation of cell characteristics can be significantly reduced.

The first floating gate electrode 3*a* can be selected from another material as the conductor. A metal film or a metal silicate film can be available. An undoped poly-crystalline silicon film without conductive impurity can be used as the second floating gate electrode 1*b*.

The isolation insulating film 4 is constituted with a silicon oxide film, for example, and is formed at both sides of the floating gate electrode 3, namely, is formed between the floating gate electrodes 3. A lower edge portion of the isolation insulating film 4 is embedded in the semiconductor substrate 1 and an upper edge portion of the isolation insulating film 4 is located between an upper surface of the semiconductor substrate 1 and an upper surface of the first floating gate electrode 3*a* to protrude from the semiconductor substrate 1. Here, a width of the isolation insulating film 4 is typically below 50 nm and a depth of the isolation insulating film 4 embedded in the semiconductor substrate 1 is typically 100-300 nm.

The intergate insulating film 5 is constituted with a stacked structure of a silicon oxide film, a silicon nitride film and a silicon oxide film in order, for example, and a thickness of the intergate insulating film 5 is typically 10-20 nm. Further, the intergate insulating film 5 is continuously formed to cover the upper surface and a side surface of the floating gate electrode 3 and an upper surface of the isolation insulating film 4. The upper surface of the isolation insulating film 4 is not necessary to be covered by the intergate insulating film 5 and may be contacted with the control gate electrode 6. However, the upper surface of the isolation insulating film 4 may be covered with the intergate insulating film 5 for improving electrical insulation between the semiconductor substrate 1 and the control gate electrode 6.

The control gate electrode 6 is constituted with a poly-crystalline silicon film doped with conductive impurity over $1\times10^{20}$ atoms/cm$^3$, such as phosphorous or the like, for example, and is formed to cover the upper surface and the side surface of the floating gate electrode 3 via the intergate insulating film 5.

The control gate electrode 6 can be selected another material as the conductor. A metal film or a metal silicate film can be available. A stacked structure of these materials can be also available.

In this embodiment, a height of the first floating gate electrode 3*a* and the second floating gate electrode 3*b* and a width of the floating gate electrode 3 are adjusted to arrange that an electrical capacity between the first floating gate electrode 3*a* and the control gate electrode 6 is larger than an electrical capacity between the second floating gate electrode 3*b* and the control gate electrode 6. On the other hand, when a thicknesses of the intergate insulating film 5 on the first floating gate electrode 3*a* and the second floating gate electrode 3*b* is approximately constant as a conventional memory cell transistor, the height of the first floating gate electrode 3*a* and the second floating gate electrode 3*b* and the width of the floating gate electrode 3 may be adjusted to arrange that an area between the first floating gate electrode 3*a* and the control gate electrode 6 opposed to each other is larger than an area between the second floating gate electrode 3*b* and the control gate electrode 6 opposite to each other.

Here, a width of a lower portion of the floating gate electrode 3, which is a channel width, is arranged to be typically below 50 nm. A width of an upper portion of the first floating gate electrode 3*a* and a width of the second floating gate electrode 3*b* are typically arranged to be below 40 nm. The thickness of the floating gate electrode 3 is set to be typically below 50-200 nm. The height of the first floating gate electrode 3*a* and the second floating gate electrode 3*b* are typically arranged to be below 40-190 nm and 10 nm, respectively. In this way, the width of the lower portion of the first floating gate electrode 3*a* is arranged to be larger than a width of another portion. In addition, the height of the first floating gate electrode 3*a* is arranged to be typically larger than the height of the second floating gate electrode 3*b*, so that the area between the first floating gate electrode 3*a* and the control gate electrode 6 opposed to each other is arranged to be larger than the area between the second floating gate electrode 3*b* and the control gate electrode 6 opposed to each other.

As a result, the electrical capacity between the second floating gate electrode 3*b* and the control gate electrode 6 is decreased accompanying with lowering an electric field applied to the intergate insulating film 5 contacting with a portion of the second floating gate electrode 3*b*, so that lowering writing speed and erasing the memory cell transistor can be suppressed.

The height of the first floating gate electrode 3*a* and the second floating gate electrode 3*b* and the width of the floating gate electrode 3 can be independently determined without influence of the conductive impurity concentration in the second floating gate electrode 3*b*.

Next, a method for fabricating the memory cell transistor is explained using FIG. 5A to FIG. 5D in the embodiment of the present embodiment. FIGS. 5A-5D are cross-sectional views along the A1-A2 line in FIG. 1.

Figure 5:
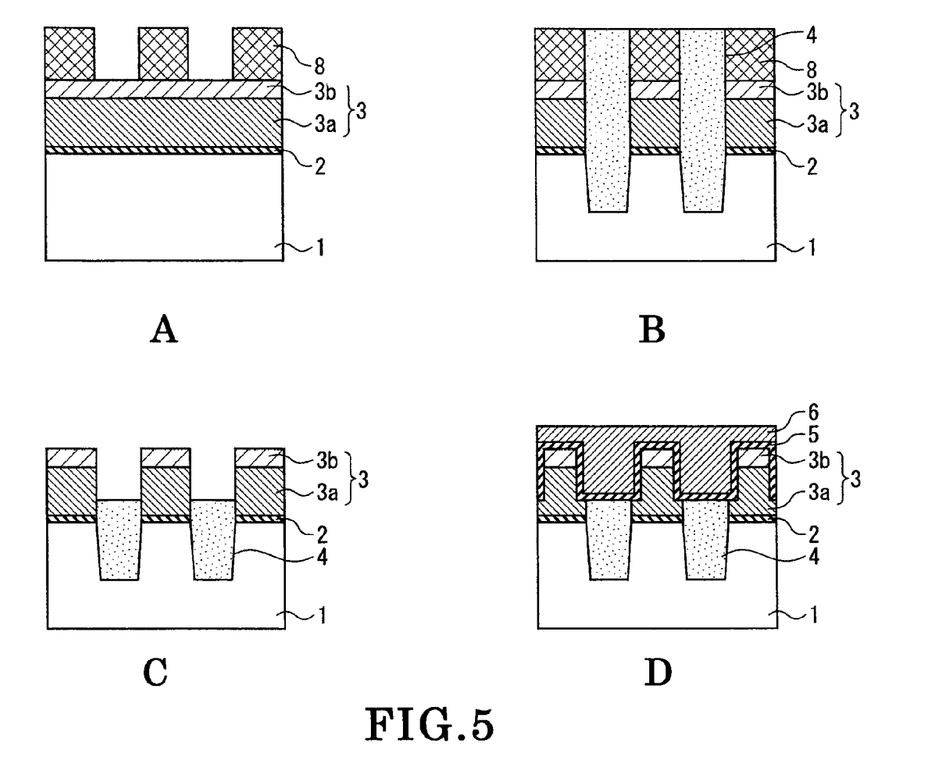
FIGS. 5A-5D are cross-sectional views showing a portion of a method for fabricating the NAND-type flash memory according to the first embodiment of the present invention.

As shown in FIG. 5A, the tunnel insulating film 2 with approximately a thickness of 10 nm is formed by thermal oxidation on the semiconductor substrate 1 doped with prescribed conductive impurity. A poly crystalline silicon film doped with phosphorous of approximately 50 nm thickness is formed on the tunnel insulating film 2 as the first floating gate electrode 3*a* by low pressure CVD (Chemical Vapor Deposition) using a mixture gas with SiH4 gas and PH3 gas. Here, a phosphorous concentration of the first floating gate electrode 3*a* is approximately $3\times10^{20}$ atoms/cm$^3$.

Successively, a poly-crystalline silicon film doped with phosphorous of approximately 10 nm thickness is formed on the first floating gate electrode 3*a* as the second floating gate electrode 3*b* by low pressure CVD using a mixture gas with SiH4 gas and PH3 gas. Here, a phosphorous concentration of the second floating gate electrode 3*b* is below $3\times10^{19}$ atoms/cm$^3$. The phosphorous concentration in the poly-crystalline silicon film can be adjusted by a method, for example, by changing a gas flow rate in growing the poly-crystalline silicon film.

After that, a silicon oxide film being a stopper film 8 for CMP (Chemical Mechanical Polish) is formed on the second floating gate electrode 3*b* by low pressure CVD, subsequently, the stopper film 8 is etched to be formed a pattern repeated with a width of approximately 50 nm and an interval of approximately 50 nm by RIE (Reactive Ion Etching) using a resist mask (not shown).

As shown in FIG. 5B, the second floating gate electrode 3*b*, the first floating gate electrode 3*a*, the tunnel insulator 2 and the semiconductor substrate 1 are etched in order by RIE using the stopper film 8 as a mask, so that both a stacked structure of the floating gate electrode 3 constituted with the first floating gate electrode 3a and the second floating gate electrode 3b is form and an isolation groove with a depth of approximately 200 nm is formed on both sides of the floating gate electrode 3. Next, a silicon oxide film with a thickness of 300 nm for the isolation is deposited on the semiconductor substrate 1 to be embedded in the isolation groove by plasma CVD. Subsequently, the silicon oxide film is removed till exposing the stopper film 8 by CMP to flatten the surface of the semiconductor substrate 1. As a result, the isolation insulating film 4 is formed.

As shown in FIG. 5C, the exposed stopper film 8 is etched to be removed by a chemical solution. Subsequently, an exposed surface portion of the isolation insulating film 4 is etched to be removed by diluted HF solution so that the isolation insulating film 4 is retreated to a level between the upper surface of the semiconductor substrate 1 and the upper surface of the first floating gate electrode 3a.

As shown in FIG. 5D, an exposed surface portion of the first floating gate electrode 3a and the second floating gate electrode 3b which are not contacted with the isolation insulating film 4 are retreated approximately 5 nm by RIE using an etching gas containing halogen element which can selectively etch to remove a silicon layer. In this way, a side surface portion of the floating gate electrode 3 not to contact with the isolation insulating film 4 is etched to be retreated, so that the lower portion of the first floating gate electrode 3a contacted with the isolation insulating film 4 is constituted as a wider structure than a width of a portion other than the lower portion of the floating gate electrode 3 not to be contacted with the isolation insulating film 4.

Next, the intergate insulating film 5a being approximately 15 nm thickness with a stacked structure constituted with a silicon oxide film, a silicon nitride film and a silicon oxide film in order is deposited by low pressure CVD, so that the upper surface of the isolation insulating film 4 and the surface portion of the floating gate electrode 3 not to be contacted with the isolation insulating film 4 are continuously covered with the intergate insulating film 5. Successively, the phosphorous-doped poly-crystalline silicon film with a thickness of 100 nm being the control gate electrode 6 is formed by low pressure CVD on the intergate insulating film 5 formed on the floating gate electrode 3 and between the adjacent floating gate electrodes 3. In this way, the memory cell transistor with the NAND-TYPE flash memory is completed as shown in FIG. 3.

According to this embodiment, as phosphorous concentration being the n-type conductive impurity in the second floating gate electrode 3b is arranged to be below $3 \times 10^{19}$ atoms/cm$^3$, the second floating gate electrode 3b acts as the nondegenerate state semiconductor. Accordingly, in a case of electric field generation between the floating gate electrode 3 and the control gate electrode 6 when writing, erasing, reading or charge retention in the memory cell transistor, increasing with a leakage current of the intergate insulating film 5 at an upper edge portion of the floating gate electrode 3 can be suppressed so that degradation of electric characteristics in the memory cell transistor can be prevented.

Furthermore, the width of the lower portion of the first floating gate electrode 3a is wider than the widths of portions other than the lower portion. The height of the first floating gate electrode 3a and the second floating gate electrode 3b and the width of the floating gate electrode 3 are adjusted to arrange that the electrical capacity between the first floating gate electrode 3a and the control gate electrode 6 is larger than the electrical capacity between the second floating gate electrode 3b and the control gate electrode 6. Accordingly, the electrical capacity between the second floating gate electrode 3b and the control gate electrode 6 is decreased accompanying with lowering an electric field applied to the intergate insulating film 5 contacting with the portion of the second floating gate electrode 3b, so that lowering writing speed and erasing speed of the memory cell transistor can be suppressed.

Figure 6:
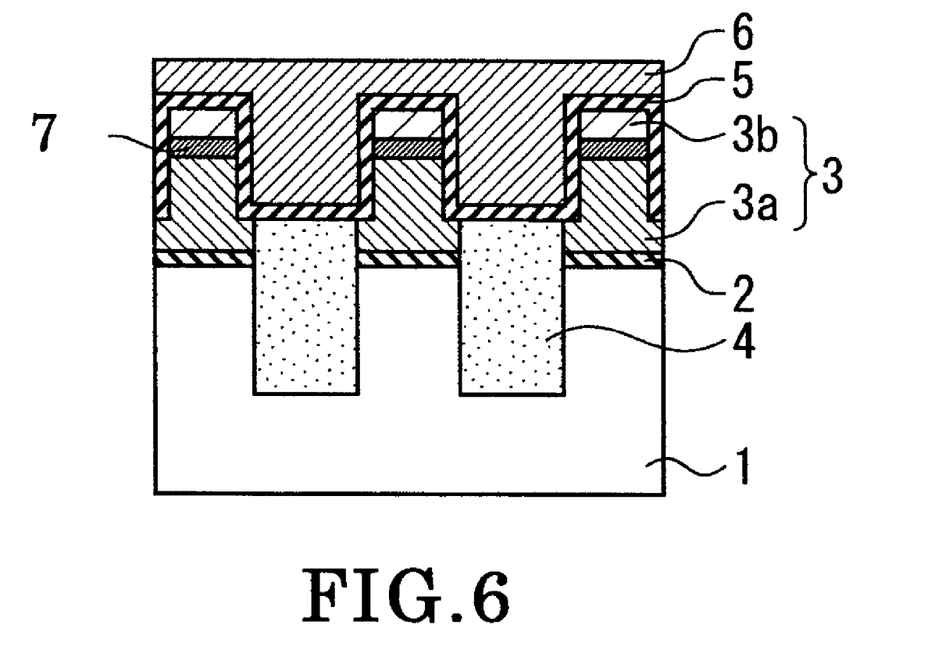
FIG. 6 is a cross-sectional view showing a structure of a NAND-type flash memory according to a modification in the first embodiment of the present invention.

In this embodiment mentioned above, the second floating gate electrode 3b is directly formed on the first floating gate electrode 3a. However, as shown in FIG. 6, the diffusion barrier film 7, for example, a silicon nitride or the like, can be formed between the first floating gate electrode 3a and the second floating gate electrode 3b. As mentioned above, the conductive impurity in the first floating gate electrode 3a can be prevented from diffusing into the second floating gate electrode 3b by locating the silicon nitride or the like between the first floating gate electrode 3a and the second floating gate electrode 3b, so that the height of the second floating gate electrode 3b can be lowered. Consequently, a parasitic capacity between adjacent cells is decreased to prevent interference between the adjacent cells, so that writing and erasing of the memory cell transistor can be speeded up.

A silicon nitride with a thickness of 1 nm can be formed as the diffusion barrier film 7 by radical nitridation, for example. The diffusion barrier film 7 is not restricted to the silicon nitride but can be used with a silicon oxy-nitride film or a silicon oxide film. However, abilities to prevent diffusion of the silicon nitride and the silicon oxy-nitride film become higher with increasing nitrogen amount in the films, therefore, the silicon nitride and the silicon oxy-nitride film may includes as much nitrogen as possible.

Furthermore, radical oxy-nitride, radical oxidation, thermal nitridation, thermal oxy-nitridation, thermal oxidation or the like may be applicable as the method for forming the diffusion barrier film 7 or a method using a chemical solution with hydrogen peroxide or ozone or the like may be used. Radical oxy-nitridation or radical oxidation using oxygen radical or nitrogen radical is desirable, as the diffusion barrier film 7 with high density can be obtained at relative low temperature. The thickness of the diffusion barrier film 7 has some extent of ability to prevent diffusion over mono atomic layer. The ability to prevent diffusion is increasing with increasing higher thickness. However, a variation of etched feature of the floating gate electrode 3 is increased in a case of being too thickness to cause a fluctuation of operation characteristics of the memory cell transistor. A natural silicon oxide below 1 nm may be favorably used, when a prescribed ability to prevent diffusion can be obtained. Further, the second floating gate electrode 3b can be arranged to the nondegenerate state by counter-doping technique. After doping one conductive element with high concentration into the floating gate electrode 3 to be the nondegenerate, a reverse conductive-type element is doped into the floating gate electrode 3 from the upper side to form the second floating gate electrode 3b with the nondegenerate state.

In this embodiment mentioned above, the width of the lower portion in the floating gate electrode 3 is formed to be wider than the portion of other than the lower portion in the floating gate electrode 3 by RIE. However, chemical solution etching, for example, using KOH solution or the like can be used. Further, the same feature as the floating gate electrode feature can be formed as mentioned below. After transforming the surface portion of the floating gate electrode 3 not to be contacted with isolation insulating film 4 to an insulator by oxidation or nitridation, the insulator is removed by diluted HF solution.

Figure 7:
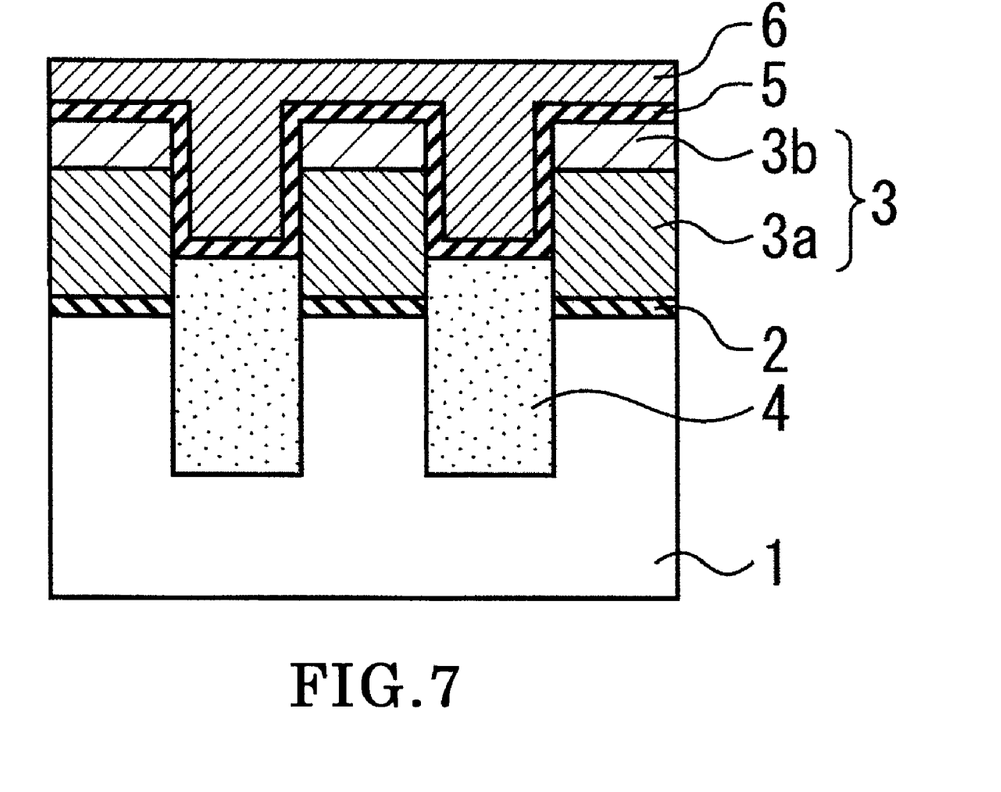
FIG. 7 is a cross-sectional view showing a NAND-type flash memory according to another Modification in the first embodiment of the present invention.

Further, the etching steps mentioned below may be omitted. The width of the upper portion in the floating gate electrode 3 arranged to be narrower than the width of the lower portion of the floating gate electrode 3. In this case, the memory cell transistor as shown in FIG. 7 is obtained. As the etching step-s are omitted, the step number is decreased. As a result, the variation of width of the floating gate electrode 3 can be lowered.

Second Embodiment

Figure 8:
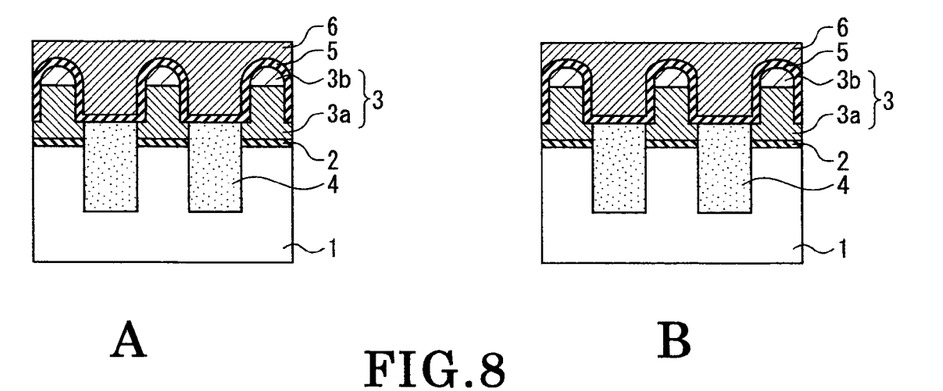
FIGS. 8A-8B are cross-sectional views showing structures of NAND-type flash memories according to a second embodiment of the present invention.

FIGS. 8A and 8B are cross-sectional views showing structures of memory transistors according to a second embodiment of the present invention. FIGS. 8A and 8B show cross-sections along the A1-A2 line in FIG. 1, in other words, the word line direction (channel width direction). The second embodiment is different from the first embodiment on a point that the upper edge surface of the floating gate electrode 3 which means the upper edge surface of the second floating gate electrode 3b, has a curved surface. It should be noted that the present invention is not restricted to the embodiments but covers their equivalents. Throughout the attached drawings, similar or same reference numerals in the first embodiment show similar, equivalent or same components. Therefore, the explanation is omitted.

As shown in FIG. 8A, the second floating gate electrode 3b may be a half circular feature as a whole or be a curved surface feature at only a leading edge portion as shown in FIG. 8B. As same as the first embodiment, the height of the first floating gate electrode 3a and the second floating gate electrode 3b, the width of the floating gate electrode 3 and a curvature of the upper edge of the floating gate electrode 3 may be adjusted to arrange that the area between the first floating gate electrode 3a and the control gate electrode 6 opposed to each other is larger than the area between the second floating gate electrode 3b and the control gate electrode 6 opposed to each other.

In the second embodiment mentioned above, as the upper edge portion of the floating gate electrode 3 has the curvature feature, the electric field applied to the upper edge portion of the floating gate electrode 3 can be smaller than that of the first embodiment. Consequently, the leakage current of the intergate insulating film 5 at the upper edge portion of the floating gate electrode 3 can be further smaller than that of the first embodiment. The decreasing effect on the leakage current is larger with decreasing the width of the floating gate electrode 3. Accordingly, degradation of electrical characteristics of the memory cell transistor can be prevented.

Figure 9:
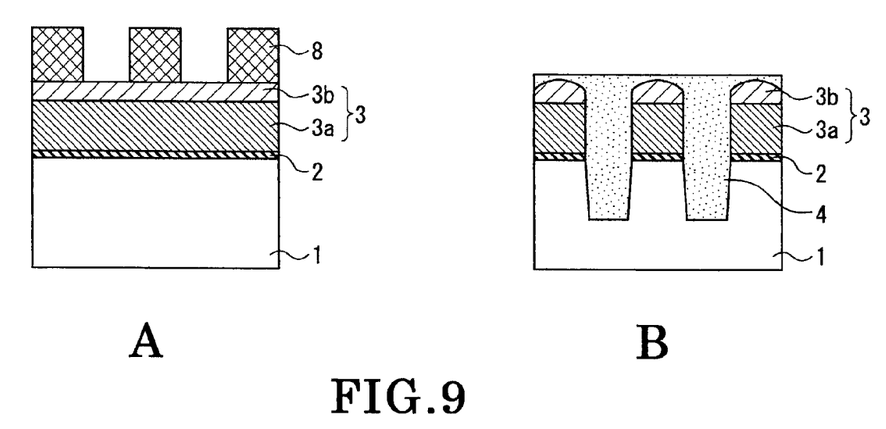
FIGS. 9A-9B are cross-sectional views showing a portion of a method for fabricating the NAND-type flash memory according to the second embodiment of the present invention.

A method for fabricating the memory cell transistor in this embodiment is explained using FIGS. 9A and 9B. FIGS. 9A and 9B show cross-sections along the A1-A2 line. As shown in FIG. 9A, a stopper film 8 constituted with a silicon oxide film is etched to be a repeated pattern with a width of approximately 50 nm and an interval of approximately 50 nm. The processing steps are the same as those of the first embodiment till the steps mentioned above.

As shown in FIG. 9B, the second floating gate electrode 3b, the first floating gate electrode 3a and the tunnel insulating film 2 are etched in order by RIE using the stopper film 8 as a mask. In the steps, an etching selection ratio of the silicon oxide film to the silicon is lowered by doping carbon contained gas such as $CH_4$ into the etching gas containing halogen element. In this way, the stopper film 8 constituted with the silicon oxide film is gradually etched in RIE process. Accompanying with the process, the upper edge portion of the second floating gate electrode 3b is also etched to form the curved surface on the upper edge portion. Further, the stopper film 8 is fully etched by adjusting the RIE condition in RIE process, so that the curvature of the upper edge portion of the floating gate electrode 3 can be changed.

Further, the exposed surface of the semiconductor substrate 1 is etched to form the isolation groove with a depth of approximately 20 nm. Next, a silicon oxide film with a thickness of 300 nm for the isolation is deposited on the semiconductor substrate 1 to be embedded in the isolation groove by plasma CVD. Subsequently, the silicon oxide film is removed to flatten the surface of the semiconductor substrate 1 so as to form the isolation insulating film 4.

After that, the same processing steps as that of the first embodiment are performed as shown in FIG. 5C and FIG. 5D mentioned below. The processing steps retreat the upper portion of the isolation insulating film 4, forming the intergate insulating film 5 and forming the control gate electrode 6. The memory cell transistor of the NAND-type flash memory as shown in FIGS. 8A and 8B is completed through the processing steps mentioned above.

In the fabricating processes, the electrical capacity between the first floating gate electrode 3a and the control gate electrode 6 is arranged to be larger than the electrical capacity between the second floating gate electrode 3b and the control gate electrode 6. On the other hand, when the thicknesses of the intergate insulating film 5 on the first floating gate electrode 3a and the second floating gate electrode 3b is approximately constant as a conventional memory cell transistor, the height of the first floating gate electrode 3a and the second floating gate electrode 3b and the width of the floating gate electrode 3 are adjusted to arrange that the area between the first floating gate electrode 3a and the control gate electrode 6 opposed to each other is larger than the area between the second floating gate electrode 3b and the control gate electrode 6 opposed to each other. The curvature of the upper edge surface of the floating gate electrode 3 can be arranged by RIE condition when the second floating gate electrode 3b, the first floating gate electrode 3a and the tunnel insulator 2 are etched in order using the stopper film 8 as the mask. In other words, NAND-type flash memory cell transistor including the curved surface only at the upper edge surface of the leading edge region in the second floating gate electrode 3b using RIE condition having less etching amount f the silicon oxide film as shown in FIG. 8B.

According to the fabricating method in this embodiment mentioned above, the second floating gate electrode 3b acts as the nondegenerate state semiconductor and the floating gate electrode 3 including the curved surface only at the upper edge portion of the leading edge region can be formed. Further, adjusting the RIE condition allows changing the curvature of the curved surface of the floating gate electrode 3 as shown in FIG. 9B. The method for forming the curved surface only at the upper edge portion of the leading edge region in the floating gate electrode 3 is not restricted to RIE mentioned above. The method by etching the upper edge portion of the floating gate electrode using a chemical solution can be applicable.

Figure 10:
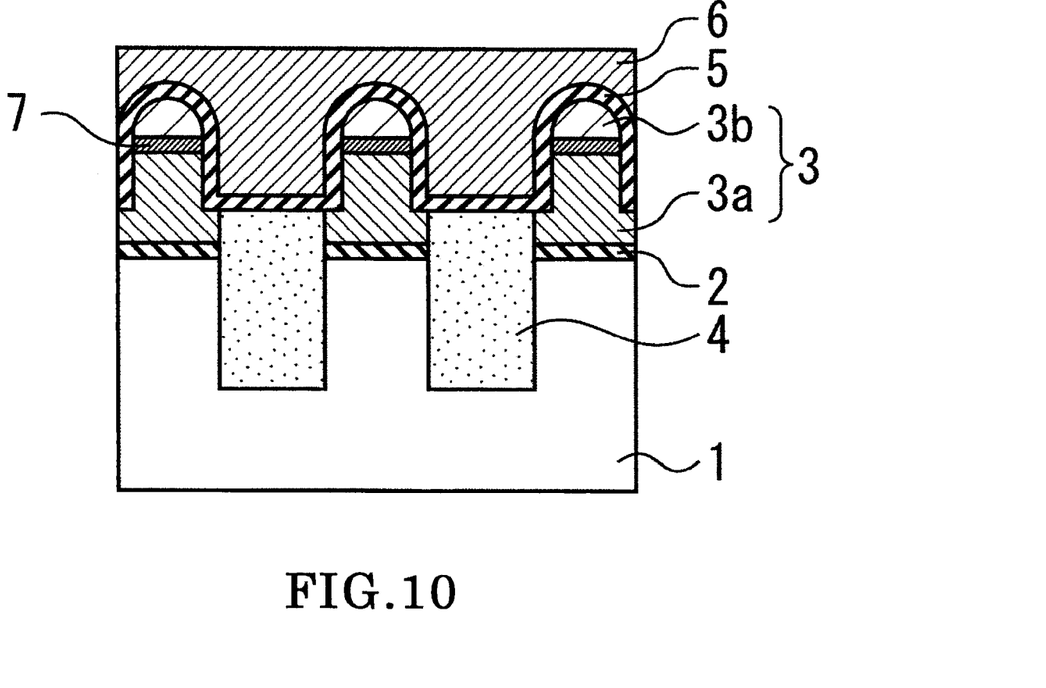
FIG. 10 is a cross-sectional view showing a structure of a NAND-type flash memory according to a modification in the second embodiment of the present invention.

Further, the diffusion barrier film 7 can be formed between the first floating gate electrode 3a and the second floating gate electrode 3b as shown in FIG. 10. The materials used in the first embodiment can be also used as the diffusion barrier film 7 in this embodiment. Moreover, the second floating gate electrode 3b can be arranged to the nondegenerate state by counter-doping technique. After doping one conductive element with high concentration into the floating gate electrode 3 to be the nondegenerate state, a reverse conductive-type element is doped into the floating gate electrode 3 from the upper side to form the second floating gate electrode 3b with the nondegenerate state as described in the first embodiment.

In a case of the upper surface of the floating gate electrode with the curved surface as this embodiment, the second floating gate electrode 3b having approximately the same thickness all over the upper surface portion can be formed by ion implantation or CVD as introducing the reverse conductive-type impurity element. Therefore, remarkable effect of lowering the leakage current in the intergate insulating film 5 can be further obtained. Especially, the method is more effective accompanying with decreasing the width of the floating gate electrode 3.

Figure 11:
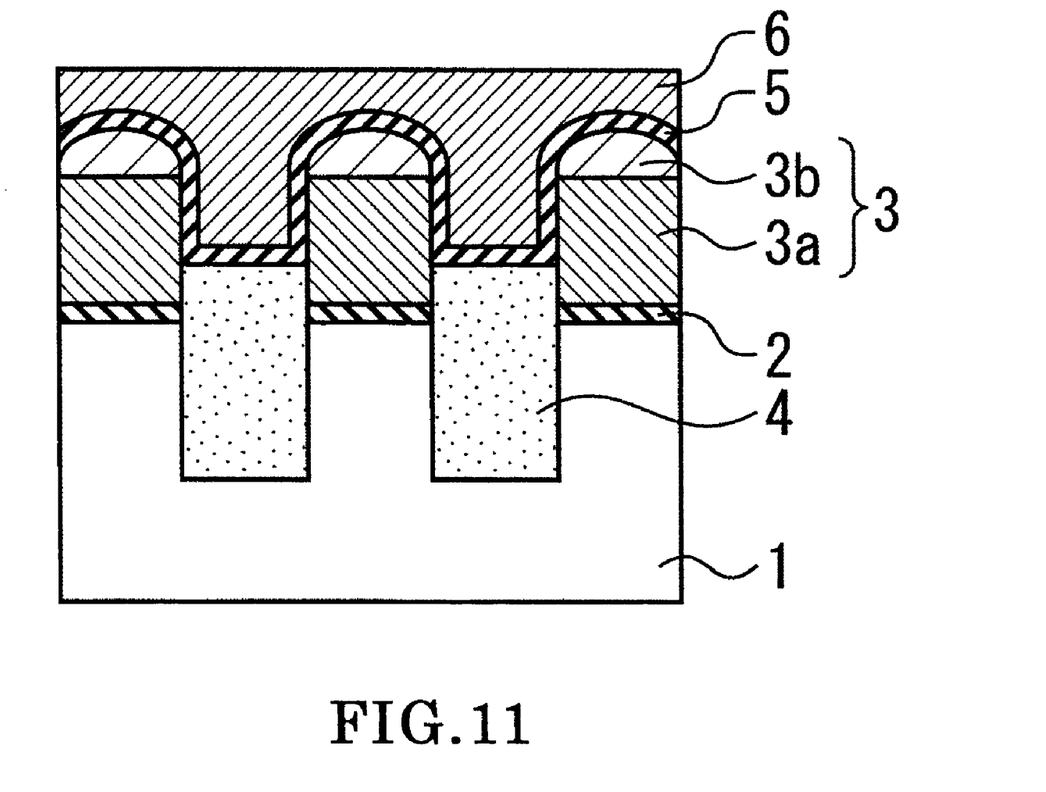
FIG. 11 is a cross-sectional view showing a structure of a NAND-type flash memory according to another modification in the second embodiment of the present invention.

Further, as described in the first embodiment, the width of the lower portion of the floating gate electrode 3 can be wider than that of the portion of other than the lower portion of the floating gate electrode 3 by etching. On the other hand, the etching steps mentioned above can be omitted. In a case of omitting the etching steps, the floating gate electrode 3 is formed to have the same width all over the floating gate electrode 3 as shown in FIG. 11. As the etching steps are omitted, the step number is decreased. As a result, the variation of width of the floating gate electrode 3 can be lowered.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A nonvolatile semiconductor memory device, comprising:
    a semiconductor substrate;
    a tunnel insulator on the semiconductor substrate;
    a floating gate electrode including a first floating gate electrode on the tunnel insulator and a second floating gate electrode on the first floating gate electrode, the second floating gate electrode including a conductive impurity element and being in a nondegenerate state;
    an intergate insulating film formed to cover at least continuously an upper and a portion of a side surface of the floating gate electrode;
    a control gate electrode on the intergate insulating film; and
    an isolation insulating film, a lower portion of the isolation insulating film being embedded in the semiconductor substrate in both sides of the floating gate electrode along a channel width direction, an upper portion of the isolation insulating film contacting with a side surface of the first floating gate electrode and protruding to a level between an upper surface of the semiconductor substrate and an upper surface of the first floating gate electrode.

2. The nonvolatile semiconductor memory device of claim 1, wherein
    the second floating gate electrode is constituted with silicon having an n-type impurity concentration below $3 \times 10^{19}$ atoms/cm$^3$.

3. The nonvolatile semiconductor memory device of claim 1, wherein the second floating gate electrode is constituted with silicon including a p-type impurity concentration below $1 \times 10^{19}$ atoms/cm$^3$.

4. The nonvolatile semiconductor memory device of claim 1, wherein
    the first floating gate electrode is constituted with semiconductor, includes an impurity element being the same conductive type as the second floating gate electrode, and has higher impurity concentration than the second floating gate electrode.

5. The nonvolatile semiconductor memory device of claim 4, wherein
    each of the first floating gate electrode and the second floating gate electrode includes a different impurity element each other, diffusion coefficient of the impurity element in the second floating gate electrode is larger than diffusion coefficient of the impurity element in the first floating gate electrode.

6. The nonvolatile semiconductor memory device of claim 1, wherein
    the first floating gate electrode is constituted with semiconductor and includes a conductive impurity element being different conductive type from the conductive impurity element in the second floating gate electrode, diffusion coefficient of the impurity element in the second floating gate electrode is larger than diffusion coefficient of the impurity element in the first floating gate electrode.

7. The nonvolatile semiconductor memory device of claim 1, wherein
    the first floating gate electrode is constituted with semiconductor and includes a conductive impurity element, the second floating gate electrode includes two kinds of conductive impurity elements, each element having a different conductive type each other.

8. The nonvolatile semiconductor memory device of claim 1, further comprising:
    an upper edge surface of the second floating gate electrode is constituted with a curved surface.

9. The nonvolatile semiconductor memory device of claim 8, wherein
    a cross-section feature in a channel width direction of the second floating gate electrode is a half circular or a circular arc only at a leading edge portion.

10. The nonvolatile semiconductor memory device of claim 1, further comprising:
    a diffusion barrier film between the first floating gate electrode and the second floating gate electrode including at least one of nitrogen and oxygen, and acting as a diffusion barrier to the conductive impurity element.

11. The nonvolatile semiconductor memory device of claim 10, wherein
    the diffusion barrier film is at least one of a silicon nitride, a silicon oxide film and a silicon oxy-nitride film.

12. The nonvolatile semiconductor memory device of claim 10, wherein
    the diffusion barrier film is formed by at least one of radical oxy-nitridation, radical oxidation, thermal nitridation, thermal oxy-nitridation, thermal oxidation and a method using a chemical solution with hydrogen peroxide or ozone.

13. The nonvolatile semiconductor memory device of claim 10, wherein
    a film thickness of the diffusion barrier film is below 2 nm.

14. The nonvolatile semiconductor memory device of claim 1, wherein
    an electrical capacity between the control gate electrode and the first floating gate electrode is larger than the electrical capacity between the control gate electrode and the second floating gate electrode.

15. The nonvolatile semiconductor memory device of claim 1, wherein
    an area of a portion of the first floating gate electrode opposed to control gate electrode is larger than an area of a portion of the second floating gate electrode opposed to the area of the control gate electrode.

16. The nonvolatile semiconductor memory device of claim 1, wherein the first floating gate electrode is a convex type and an upper surface portion of the first floating gate electrode is superimposed on a lower surface portion of the second floating gate electrode, and the intergate insulating film continuously covers the upper surface and the side surface of the floating gate electrode.

* * * * *